United States Patent
Kang et al.

(10) Patent No.: US 7,765,359 B2
(45) Date of Patent: Jul. 27, 2010

(54) FLASH MEMORY SYSTEM AND PROGRAMMING METHOD PERFORMED THEREIN

(75) Inventors: Shin-wook Kang, Hwaseong-si (KR); Dong-woo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 510 days.

(21) Appl. No.: 11/730,800

(22) Filed: Apr. 4, 2007

(65) Prior Publication Data

US 2008/0049520 A1  Feb. 28, 2008

(30) Foreign Application Priority Data

Aug. 23, 2006  (KR) .............. 10-2006-0079947

(51) Int. Cl.
*G06F 12/00* (2006.01)

(52) U.S. Cl. .................. 711/103; 365/185.33
(58) Field of Classification Search ........ 711/103; 365/185.33
See application file for complete search history.

(56) References Cited

U.S. PATENT DOCUMENTS

| | | | | |
|---|---|---|---|---|
| 6,725,321 | B1 * | 4/2004 | Sinclair et al. | 711/103 |
| 7,568,075 | B2 * | 7/2009 | Fujibayashi et al. | 711/154 |
| 2003/0163629 | A1 * | 8/2003 | Conley et al. | 711/103 |
| 2005/0114587 | A1 * | 5/2005 | Chou et al. | 711/103 |
| 2006/0036897 | A1 | 2/2006 | Lin et al. | |
| 2006/0075395 | A1 * | 4/2006 | Lee et al. | 717/168 |

FOREIGN PATENT DOCUMENTS

KR  10-2004-0054936 A  6/2004

* cited by examiner

*Primary Examiner*—Christian P Chace
*Assistant Examiner*—Hashem Farrokh
(74) *Attorney, Agent, or Firm*—Sughrue Mion, PLLC

(57) ABSTRACT

Provided are a flash memory system and a programming method performed in the flash memory system. The flash memory system includes a buffer unit including a plurality of buffers, and temporarily storing data transmitted by a host; a plurality of channel units each including at least one flash memory chip that includes a plurality of memory cell arrays; and a control unit which controls the data stored in the buffer unit to be sequentially transmitted to the channel units and the transmitted data to be recorded to the memory cell arrays of the flash memory chips in the channel units.

11 Claims, 5 Drawing Sheets

FLASH MEMORY SYSTEM AND PROGRAMMING METHOD PERFORMED THEREIN

CROSS-REFERENCE TO RELATED PATENT APPLICATION

This application claims priority from Korean Patent Application No. 10-2006-0079947, filed on Aug. 23, 2006, in the Korean Intellectual Property Office, the disclosure of which is incorporated herein in its entirety by reference.

BACKGROUND OF THE INVENTION

1. Field of the Invention

Systems and methods consistent with the present invention relate to a memory device and a programming method performed therein, and more particularly, to a flash memory system capable of increasing the overall bandwidth and data recording speed by achieving simultaneous performance of sequential transmission of data to each channel unit and storage of data transmitted from a host by using a plurality of buffers, and a programming method performed in the flash memory system.

2. Description of the Related Art

Flash memories, which are non-volatile memories capable of electrically deleting or re-recording data, are classified into a NOR type and a NAND type according to how cells and bitlines are connected to each other.

NAND flash memories, which are storage areas for storing information, include memory cell arrays. A memory cell array includes a plurality of cell strings (which are also called NAND strings). In order to store data in a memory cell array of a flash memory or read data therefrom, the flash memory is provided with a page register circuit. As is well known to those of ordinary skill in the art, memory cells of a NAND flash memory are erased and programmed using a Fowler-Nordheim (F-N) tunneling current.

In order to store data in the memory cell array of the flash memory, first, a write command is given to the flash memory, and addresses and data are consecutively input to the flash memory. Generally, data, which is to be programmed, is sequentially transmitted to a page register circuit on a byte-by-byte basis or on a word-by-word basis. When the to-be-programmed data corresponding to one page of data is completely loaded to the page register circuit, data preserved in the page register circuit is programmed simultaneously in the memory cell array according to a programming command.

In the related art, in order to increase the recording speed of such a flash memory system, a method of programming page data in a plurality of flash memory chips included in each channel according to an interleaving process, or a method of increasing the number of channels and allocating page data to each of the channels has been proposed.

FIG. 1 is a block diagram of a configuration of a related art 2-channel flash memory system 20 using a plurality of flash memory chips. FIG. 2 illustrates a sequence in which data to be recorded in the flash memory system 20 shown in FIG. 1 is transmitted.

Referring to FIG. 1, the related art 2-channel flash memory system 20 includes a host interface unit 21 receiving to-be-recorded data by means of communication with a host 10, a buffer unit 22 storing received data, a control unit 24, and first through fourth flash memory chips 25, 26, 27, and 28. The first and second flash memory chips 25 and 26 constitute a first channel unit CH1, and the third and fourth flash memory chips 27 and 28 constitute a second channel unit CH2.

The host 10 divides the to-be-recorded data into several pieces of data of predetermined size and transmits the divided data. The data received from the host 10 are temporally stored in the buffer unit 22 that is allocated to and stored in the first and second channels CH1 and CH2. For example, referring to FIG. 2, when an 4 Kbyte cluster comprising two pieces of 2 Kbyte page data P1 and P2 is received from the host 10, a first byte of the first page data P1 is allocated to and stored in the first channel unit CH1, and a second byte of the second page data P2 is allocated to and stored in the second channel unit CH2. After the first page data P1 is allocated to and stored in the first channel unit Ch1 and the second channel unit Ch2, each byte of the second page data P2 is allocated to and stored in the first channel unit CH1 and the second channel unit Ch2. More specifically, the first 4 Kbyte cluster data received from the host 10 is allocated to and stored in the first flash memory chip 25 of the first channel unit CH1 and the third flash memory chip 27 of the second channel unit CH2. Then each of the first and second channel units CH1 and CH2 records 2 Kbyte page data to each of the flash memory chips included therein in units of byte, using an interleaving process. During the first 4 Kbyte cluster data is allocated to and stored in the first flash memory chip 25 of the first channel unit CH1 and the third flash memory chip 26 of the second channel unit CH2, the second 4 Kbyte cluster data received from the host 10 is allocated to and stored in the buffers of the second flash memory chip 26 of the first channel unit CH1 and the fourth flash memory chip 28 of the second channel unit CH2. In other words, the interleaving process is performed between the first flash memory chip 25 and the second flash memory chip 26 of the first channel unit CH1, and between the third flash memory chip 27 and the fourth flash memory chip 28 of the second channel unit CH2, respectively. According to this related art, 4 Kbyte data can be recorded during the period of time that 2 Kbyte data is being recorded.

However, in the related art, even when an interleaving process is applied between chips included in the same channel or when the number of the channel is increased, there is a limit as to how much the data recording speed can be improved. When data is recorded to a plurality of memory cell arrays or flash memory chips included in a single channel according to an interleaving process, a bandwidth is limited due to the recording time tWC of the flash memory chip itself. If the recording time tWC of 1 byte data is 25 ns, a possible maximum bandwidth is limited to 40 MB/s (=1 byte/25 ns) even when the bandwidth is improved due to the use of an interleaving process. When the number of channels is increased in order to increase the bandwidth, the size of data being transmitted from a host to a flash memory system increases, leading to an increase in the size of a buffer that temporarily stores the data transmitted by the host. In this case, in order to provide 2 Kbyte page data to each of the channel units CH1 and CH2 of the flash memory system 20, the host 10 should transmit 4 Kbyte data at a time, and the buffer unit 22 should have a size of at least 8 Kbyte for the interleaving process. Also, a cluster gap may be generated due to the increase in size of the unit of a physical data access rate. For example, the host 10 transmits data in units of 8 Kbyte clusters even when data, which is to be actually recorded, is only 2 Kbyte. Accordingly, an empty space is generated in the cluster.

SUMMARY OF THE INVENTION

The present invention provides a flash memory system capable of increasing the overall bandwidth and data recording speed without increasing the size of data to be transmitted by a host, and a programming method performed in the flash memory system.

According to an aspect of the present invention, there is provided a flash memory system comprising: a buffer unit comprising a plurality of buffers, and temporarily storing data transmitted by a host; a plurality of channel units each comprising at least one flash memory chip that comprises a plurality of memory cell arrays; and a control unit which controls the data stored in the buffer unit to be sequentially transmitted to the channel units and the transmitted data to be recorded to the memory cell arrays of the flash memory chips in the channel units.

The control unit may control one of the buffers to transmit the temporarily stored data to a corresponding channel unit of the plurality of channel units and simultaneously controls another buffer to store data transmitted by the host.

When a number of channel units is n (where n is an integer), the buffer unit may comprise (n+1) buffers.

Each of the buffers has a storage capacity of at least one page that is recorded in a memory cell array of the memory cell arrays.

When a number of channel units is n (where n is an integer) and a size of one page recorded in a memory cell array of the memory cell arrays is s, the overall storage capacity of the buffers included in the buffer unit may be s×(n+1).

The control unit may include a plurality of memory controllers connected to the channel units so as to independently control the channel units. Each of the memory controllers connected to the channel units may record data received from each of the buffers to the memory cell arrays included in each of the channel units according to an interleaving process.

According to another aspect of the present invention, there is provided a programming method performed in a flash memory system, the method comprising: sequentially transmitting data transmitted by a host and stored in a plurality of buffers, to a plurality of channel units and storing data transmitted by the host in emptied buffers among the buffers, wherein each of the channel units comprises at least one flash memory chip that comprises a plurality of memory cell arrays; and recording the stored data to the memory cell arrays of the flash memory chips included in the channel units.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENT THE INVENTION

The present invention will now be described more fully with reference to the accompanying drawings, in which exemplary embodiments of the invention are shown.

Figure 1:
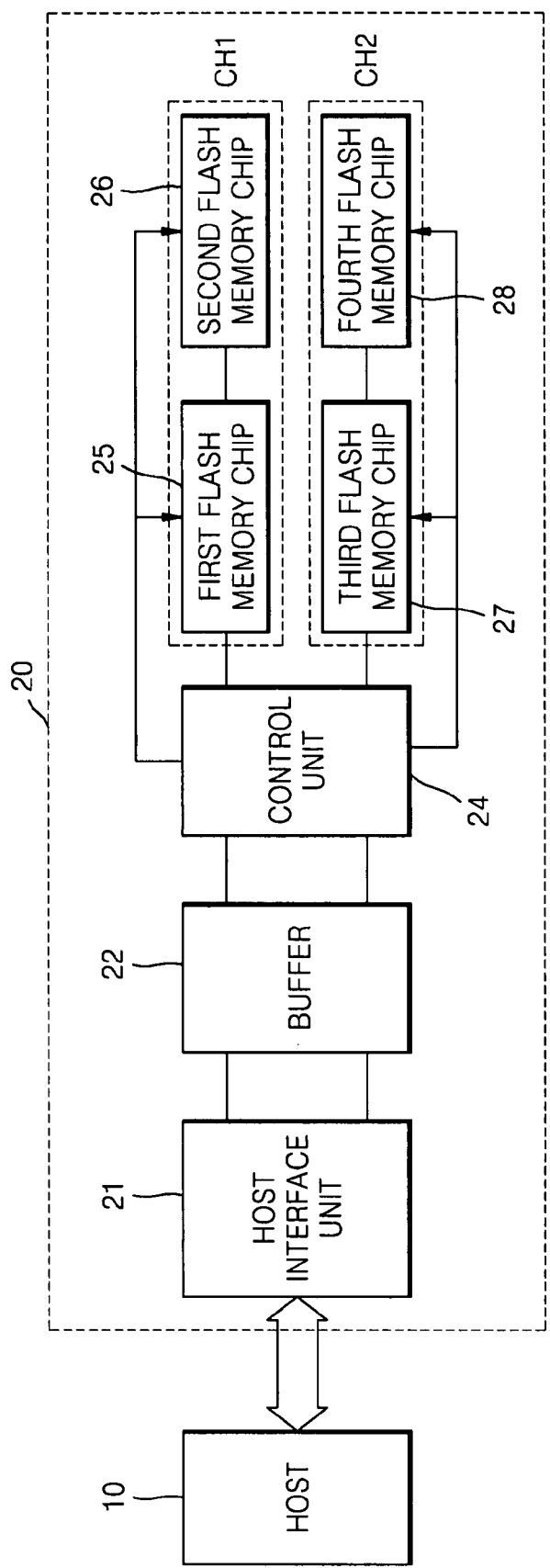
FIG. 1 is a block diagram of a configuration of a related art 2-channel flash memory system using a plurality of flash memory chips.
Figure 2:
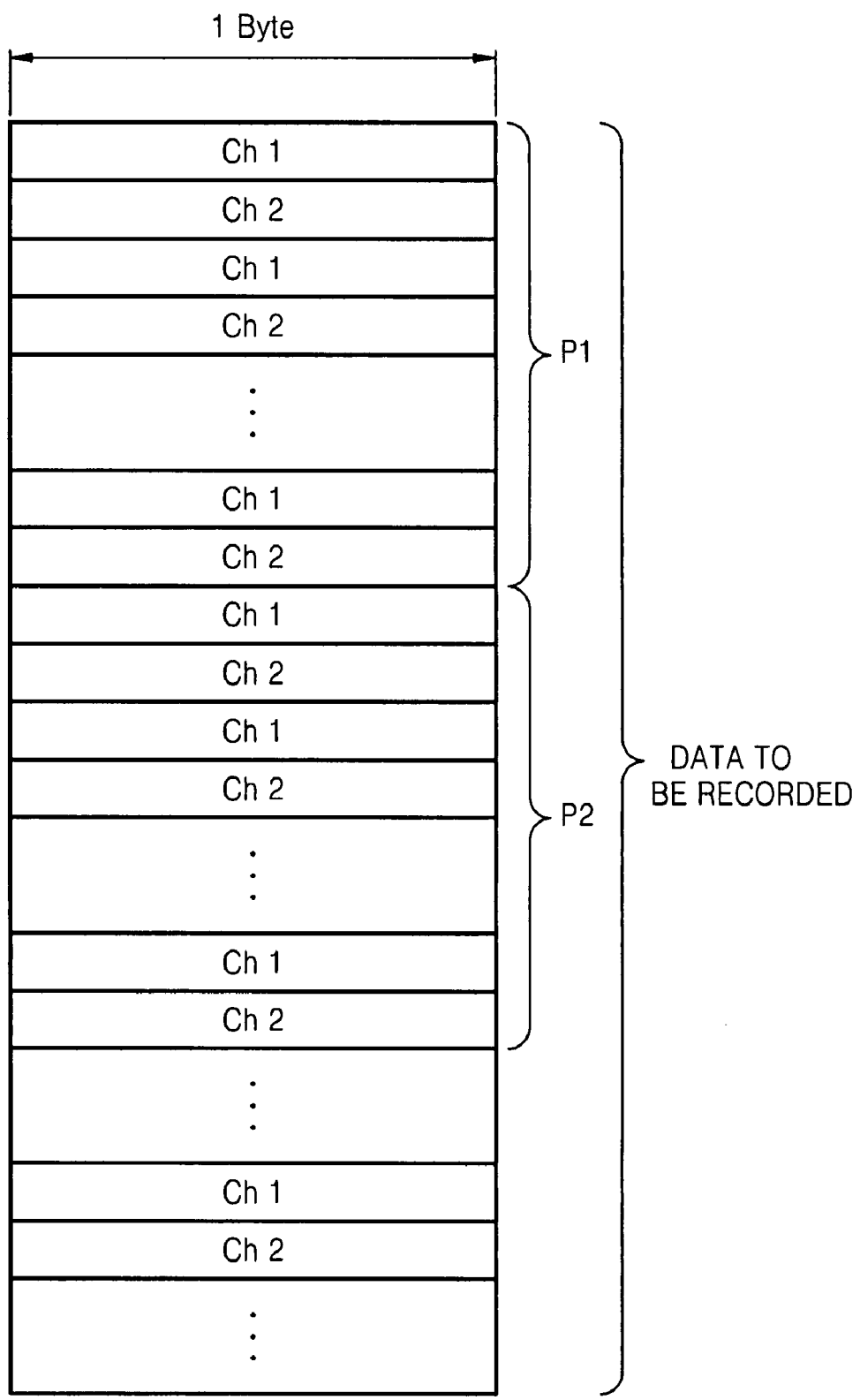
FIG. 2 illustrates a sequence in which data to be recorded in the flash memory system of FIG. 1 is transmitted.
Figure 3:
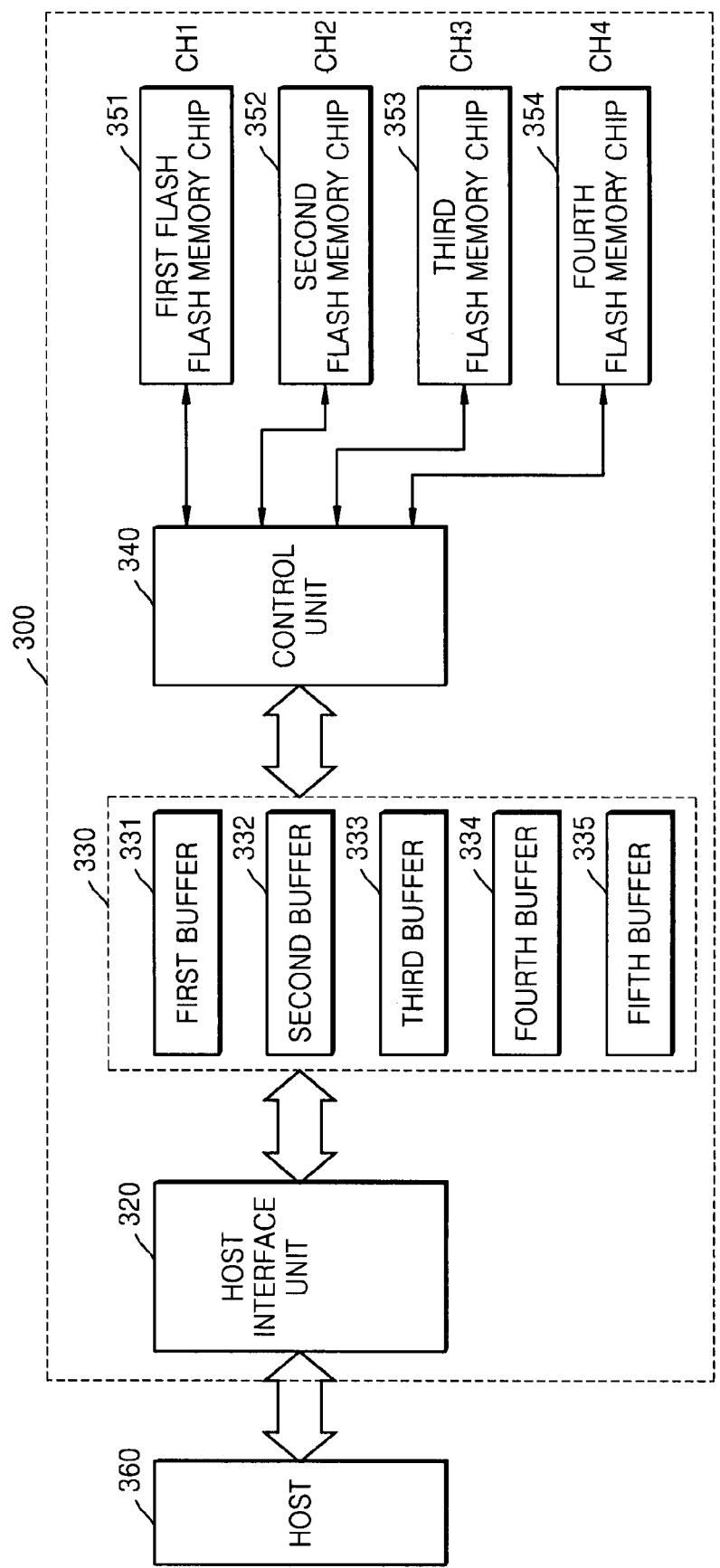
FIG. 3 is a block diagram of a flash memory system according to an exemplary embodiment of the present invention.

FIG. 3 is a block diagram of a flash memory system 300 according to an exemplary embodiment of the present invention. Referring to FIG. 3, the flash memory system 300 includes a host interface unit 320, a buffer unit 330 including a plurality of buffers 331 through 335, a control unit 340, and a plurality of flash memory chips 351, 352, 353, and 354. The flash memory chips 351, 352, 353, and 354 form channel units CH1, CH2, CH3, and CH4, respectively. However, the present invention is not limited to this configuration. That is, each of the channel units CH1, CH2, CH3, and CH4 may further include at least one flash memory chip.

The host interface unit 320 sequentially transmits page data received from the host 360 to the buffers 331 through 335, according to the sequence in which the page data is transmitted by the host 360.

The buffers 331 through 335 temporarily store the page data transmitted by the host 360 and sequentially transmits the stored page data to the flash memory chips 351, 352, 353, and 354 under the control of the control unit 340. Any of the buffers 331 through 335 that are emptied are re-filled with data transmitted by the host 360. As described above, the flash memory system 300 includes the plurality of buffers 331 through 335, so that sequential transmission of page data stored in one buffer to the flash memory chips 351, 352, 353, and 354 under the control of the control unit 340 and storage of page data transmitted by the host 360 in the flash memory chips 351, 352, 353 and 354 can occur simultaneously.

When the number of channel units included in the flash memory system 300 is n (where n is an integer), the number of buffers is preferably (n+1). In FIG. 3, because the flash memory system 300 includes the four channel units CH1 through CH4, the buffer unit 330 includes the five buffers 331 through 335. The reason why a flash memory system according to an exemplary embodiment of the present invention having n channel units includes (n+1) buffers is that, while n buffers are transmitting data to the n channel units, the remaining buffer can store data transmitted by a host. When data transmitted by a host is alternately stored in a plurality of buffers and then the storage process is repeated and at the same time the data is sequentially transmitted to channel units as described above, the recording speed and bandwidth of data can be enhanced without increasing the size of data being transmitted by the host. In other words, a related art flash memory system receives data of a size proportional to the number of channel units from a host and stores the data in a single buffer, and then divides the data and allocates the divided data to the channel units. However, the flash memory system 300 according to an exemplary embodiment of the present invention consecutively receives data of a size required to be recorded in each channel unit, stores the data in a plurality of buffers, and sequentially transmits the stored data to the channel units. Thus, the flash memory system 300 can improve the data recording speed and the bandwidth without increasing the size of data that is transmitted by a host.

In order to obtain this effect, each of the buffers 331 through 335 may have a storage capacity that can store at least one page that is to be recorded in the memory cell array. Also, when the number of channel units is n (where n is an integer)

and the size of one page recorded in a memory cell array is s, the overall storage capacity of the buffers 331 through 335 is preferably at least s×(n+1).

Figure 4:
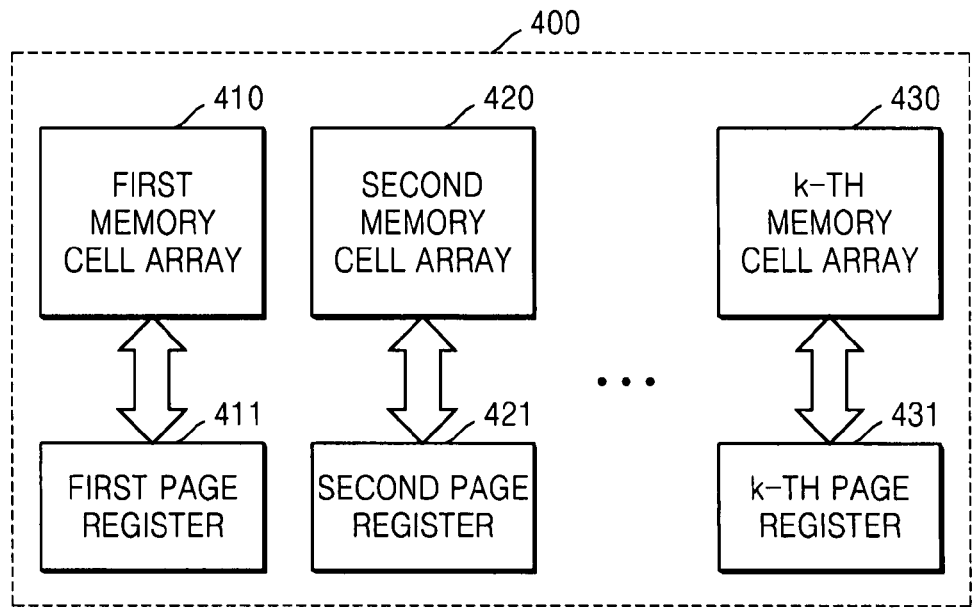
FIG. 4 is a block diagram schematically illustrating a configuration of a flash memory chip illustrated in FIG. 3.

FIG. 4 is a block diagram schematically illustrating a configuration of each of the flash memory chips 351, 352, 353, and 354 illustrated in FIG. 3. In FIG. 4, a flash memory chip 400 corresponds to each of the flash memory chips 351, 352, 353, and 354.

Referring to FIG. 4, the flash memory chip 400 includes k memory cell arrays 410, 420, ..., and 430 and k page registers 411, 421, ..., and 413. Here, k denotes an integer. The number of memory cell arrays included in the flash memory chip 400 and the number of page registers corresponding to the memory cell arrays may be changed. The control unit 340 can increase the recording speed by alternately recording page data to the plurality of memory cell arrays included in a single flash memory chip according to an interleaving process.

Figure 5:
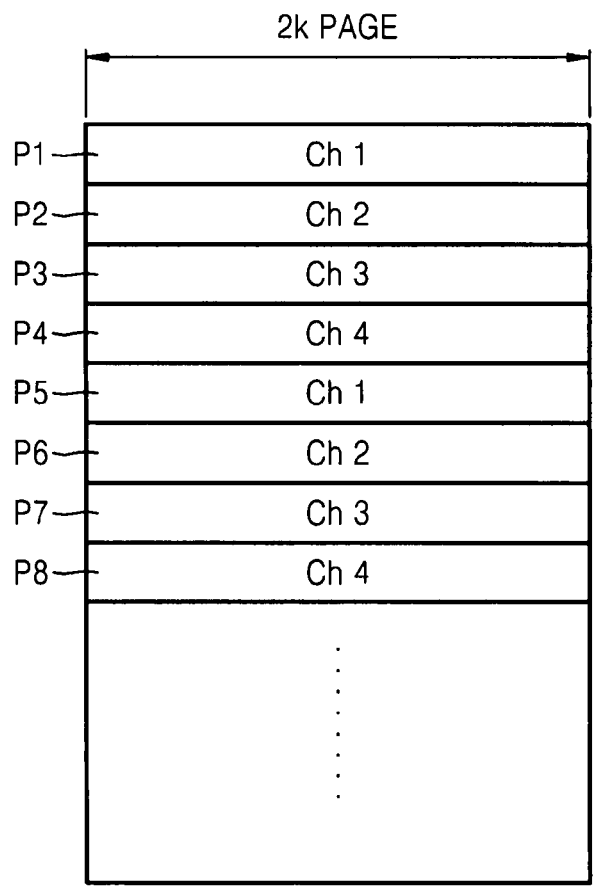
FIG. 5 illustrates a sequence in which data to be recorded in the flash memory system illustrated in FIG. 3 is transmitted.
Figure 6:
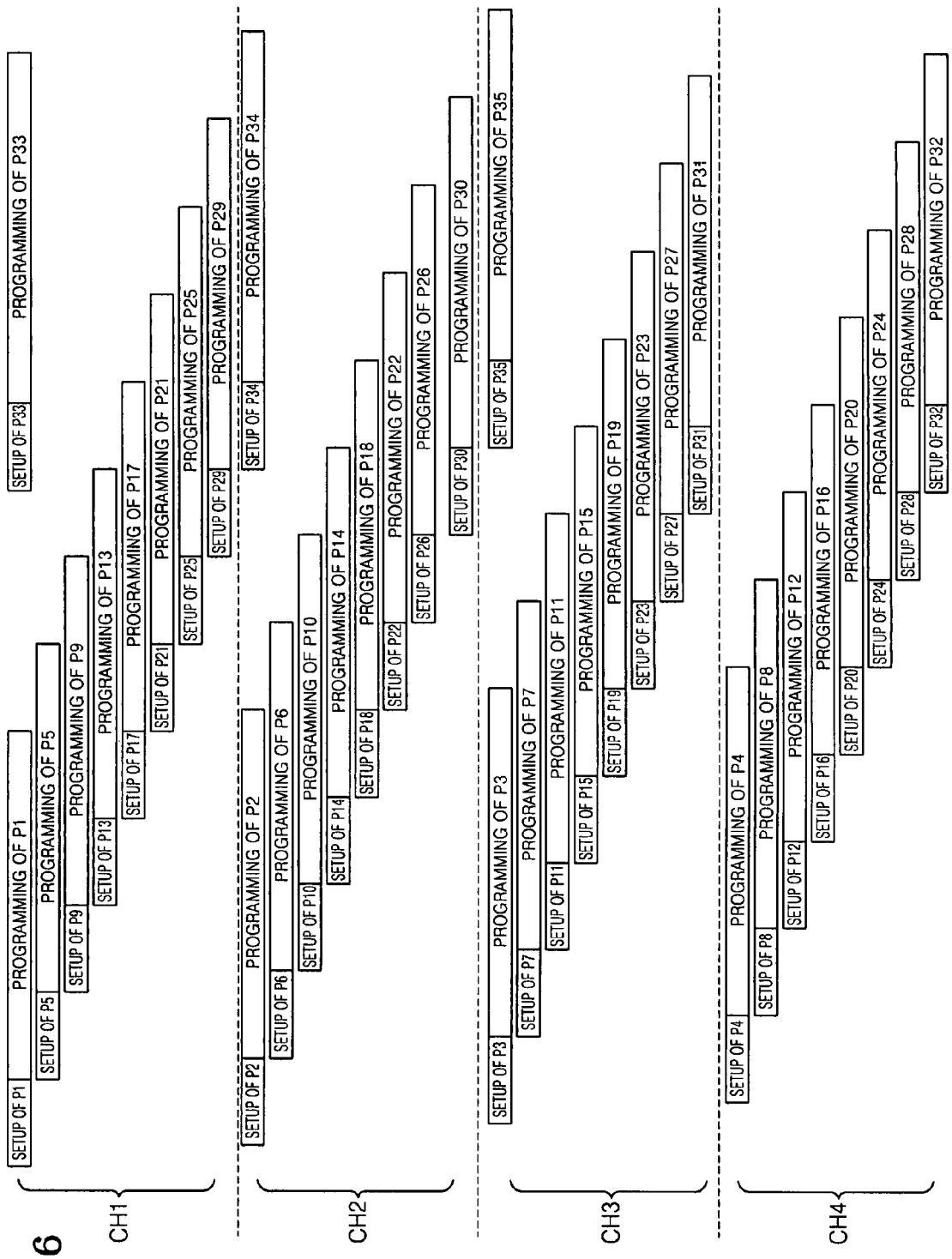
FIG. 6 is a timing diagram illustrating an operational state of each channel unit of the flash memory system illustrated in FIG. 3.

FIG. 5 illustrates a sequence in which data to be recorded in the flash memory system 300 illustrated in FIG. 3 is transmitted. FIG. 6 is a timing diagram illustrating an operational state of each of the channel units CH1, CH2, CH3, and CH4 of the flash memory system 300 illustrated in FIG. 3. A recording operation of the flash memory system 300 will now be described in detail with reference to FIGS. 3 through 6.

Referring to FIG. 5, the host 360 divides to-be-recorded data into 2 Kbyte page data and transmits the divided page data. The host 360 may divide the to-be-recorded data into sector-unit data smaller than the 2 Kbyte page data. In this case, the host interface unit 320 combines the received sector-unit data into page data, which is the unit in which data is written in or read from flash memory chips.

The page data transmitted by the host 360 are sequentially stored in the buffers 331 through 335 according to the sequence in which the page data is transmitted by the host 360. For example, first page data P1 is stored in the first buffer 331, second page data P2 is stored in the second buffer 332, third page data P3 is stored in the third buffer 333, fourth page data P4 is stored in the fourth buffer 334, and fifth page data P5 is stored in the fifth buffer 335.

Referring to FIG. 6, first, the first page data P1 stored in the first buffer 331 is recorded to a first memory cell array of the first flash memory chip 351 of the first channel unit CH1 under the control of the control unit 340. Here, it is assumed that each of the flash memory chips 351, 352, 353, and 354 includes 8 memory cell arrays. A recording operation is divided into a setup operation and a programming operation. An operation of loading data to a page register included in a flash memory chip is referred to as a setup operation. The time required to perform the setup operation is referred to as a setup time. An operation of programming page data loaded in a page register included in a flash memory chip into a memory cell array is referred to as a programming operation. The time required to perform the programming operation is referred to as a programming time.

While the first page data P1 is being recorded, the second page data P2 stored in the second buffer 332 is recorded to a first memory cell array included in the second flash memory chip 352 of the second channel unit CH2. While the second page data P2 is being recorded, the third page data P3 stored in the third buffer 333 is recorded to a first memory cell array included in the third flash memory chip 353 of the third channel unit CH3. While the third page data P3 is being recorded, the fourth page data P4 stored in the fourth buffer 334 is recorded to a first memory cell array included in the fourth flash memory chip 354 of the fourth channel unit CH4.

After the recording of the first page data P1 to the first memory cell array of the first flash memory chip 351 is completed, the fifth page data P5 stored in the fifth buffer 335 is recorded to a second memory cell array of the first channel unit CH1. After the recording of the second page data P2 to the first memory cell array of the second flash memory chip 352 is completed, sixth page data P6 stored in the first buffer 331 is recorded to a second memory cell array of the second channel unit CH2. As described above, the control unit 340 sequentially allocates the page data stored in the buffers 331 through 335 to the channel units CH1 through CH4 and controls the page data to be recorded to the memory cell arrays included in each of the channel units CH1 through CH4 sequentially. In other words, the control unit 340 controls recording to the memory cell arrays included in each channel so that it is performed according to an interleaving process and also so that the recordings performed in the channels overlap each other. As described above, during recording, when data stored in a buffer is loaded to a page register and thus the buffer is emptied, the buffer is re-filled with data transmitted by a host.

As illustrated in FIG. 6, when recording to the memory cell arrays of the flash memory chips included in the four channel units CH1 through CH4 is performed, data is input to the buffer unit 330 about four times faster than related art recording. Because the recording operations in the fourth channel units CH1 through CH4 overlap each other, the speed of recording to all of the four channel units CH1 through CH4 is 160 MB/s even when the speed of recording to each of the four channel units CH1 through CH4 is 40 MB/s. Hence, the bandwidth of an input transmitted by the host 360 and stored in the buffer unit 330 is 160 MB/s. Therefore, the bandwidth between the host 360 and the flash memory system 300 is improved.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion.

According to exemplary embodiments of the present invention as described above, the bandwidth between a host and a flash memory system and the recording speed can be increased without increasing the size of data being transmitted from the host to the flash memory system.

Additionally, because the size of data being transmitted from the host to the flash memory system is small, the generation of a cluster gap due to an increase in size of a data access unit can be reduced. Furthermore, large amounts of data can be efficiently processed due to overlapping recording operations in channel units.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flash memory system comprising:
  a buffer unit comprising a plurality of buffers, and temporarily storing data transmitted by a host;

a plurality of channel units each comprising at least one flash memory chip that comprises a plurality of memory cell arrays; and a control unit which controls the data stored in the buffer unit to be sequentially transmitted to the channel units and the transmitted data to be recorded to the memory cell arrays of the flash memory chips in the channel units, wherein when a number of channel units is n (where n is an integer) and a size of one page recorded in a memory cell array of the memory cell array is s, the buffer unit comprises (n+1) buffers and the overall storage capacity of the buffers included in the buffer units is s.times.(n+1).

2. The flash memory system of claim 1, wherein the control unit controls one of the buffers to transmit the temporarily stored data to a corresponding channel unit of the plurality of channel units and simultaneously controls another buffer of the buffers to store data transmitted by the host.

3. The flash memory system of claim 1, wherein each of the buffers has a storage capacity of at least one page that is recorded in a memory cell array of the memory cell arrays.

4. The flash memory system of claim 1, wherein the control unit includes a plurality of memory controllers connected to the channel units so as to independently control the channel units, and each of the memory controllers connected to the channel units records data received from each of the buffers to the memory cell arrays included in each of the channel units according to an interleaving process.

5. The flash memory system of claim 1, wherein the control unit controls one of the buffers to transmit the temporarily stored data to one channel unit of the plurality of channel units and controls another buffer of the buffers to transmit the temporarily stored data to another channel unit of the plurality of channel units so that recordings performed in the channels overlap each other.

6. A flash memory system comprising:
a buffer unit comprising a plurality of buffers, and temporarily storing data transmitted by a host;
a plurality of channel units each comprising at least one flash memory chip that comprises a plurality of memory cell arrays; and
a control unit which controls the data stored in the buffer unit to be sequentially transmitted to the channel units and the transmitted data to be recorded to the memory cell arrays of the flash memory chips in the channel units,
wherein when a number of channel units is n (where n is an integer) and a size of one page recorded in a memory cell array of the memory cell arrays is s, the overall storage capacity of the buffers included in the buffer unit is s×(n+1).

7. A programming method performed in a flash memory system, the method comprising:
sequentially transmitting data transmitted by a host and stored in a plurality of buffers, to a plurality of channel units and storing data transmitted by the host in emptied buffers among the buffers, wherein each of the channel units comprises at least one flash memory chip that comprises a plurality of memory cell arrays; and
recording the stored data to the memory cell arrays of the flash memory chips included in the channel units,
wherein when a number of the channel units is n (where n is an integer) and a size of one page recorded in a memory cell array of the memory cell array is s, a number of buffers is (n+1) and the overall storage capacity of the buffers included in the buffer units is s.times.(n+1).

8. The programming method of claim 7, wherein each of the buffers has a storage capacity of at least one page that is recorded in a memory cell array of the memory cell arrays.

9. The programming method of claim 7, wherein in the recording of the stored data to the memory cell arrays of the flash memory chips included in the channel units, data received from each of the buffers is recorded to the memory cell arrays included in each of the channel units according to an interleaving process.

10. The programming method of claim 7, wherein the recording performed in the channels overlap each other.

11. A programming method performed in a flash memory system, the method comprising:
sequentially transmitting data transmitted by a host and stored in a plurality of buffers, to a plurality of channel units and storing data transmitted by the host in emptied buffers among the buffers, wherein each of the channel units comprises at least one flash memory chip that comprises a plurality of memory cell arrays; and
recording the stored data to the memory cell arrays of the flash memory chips included in the channel units,
wherein when a number of channel units is n (where n is an integer) and the size of one page recorded in a memory cell array is s, the overall storage capacity of the buffers included in the buffer unit is s×(n+1).

* * * * *